(12) United States Patent
Wang

(10) Patent No.: US 12,406,840 B2
(45) Date of Patent: Sep. 2, 2025

(54) SEMICONDUCTOR STRUCTURE AND FORMING METHOD THEREOF

(71) Applicant: CHANGXIN MEMORY TECHNOLOGIES, INC., Hefei (CN)

(72) Inventor: Peimeng Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 576 days.

(21) Appl. No.: 17/660,060

(22) Filed: Apr. 21, 2022

(65) Prior Publication Data

US 2023/0041544 A1 Feb. 9, 2023

Related U.S. Application Data

(63) Continuation of application No. PCT/CN2022/076281, filed on Feb. 15, 2022.

(30) Foreign Application Priority Data

Aug. 4, 2021 (CN) .......................... 202110890950.6

(51) Int. Cl.
*H01L 21/02* (2006.01)
*H01L 21/3105* (2006.01)
*H10B 12/00* (2023.01)

(52) U.S. Cl.
CPC .. *H01L 21/02065* (2013.01); *H01L 21/31055* (2013.01); *H10B 12/03* (2023.02)

(58) Field of Classification Search
CPC ................ H10B 12/03; H10B 12/0335; H01L 21/02244; H01L 21/31055;

(Continued)

(56) References Cited

U.S. PATENT DOCUMENTS

| 5,496,774 A | 3/1996 | Pramanik et al. |
| 6,833,324 B2 * | 12/2004 | Bonsdorf .......... H01L 21/67028 438/692 |

(Continued)

FOREIGN PATENT DOCUMENTS

| CN | 111566786 A | 8/2020 |
| CN | 111755381 A | 10/2020 |

(Continued)

OTHER PUBLICATIONS

Xu, et al., "Study of tungsten oxidation in O2/H2/N2 downstream plasma", J. Vac. Sci. Technol. A 26(3), May/Jun. 2008, 5 pages.

(Continued)

*Primary Examiner* — Vongsavanh Sengdara
(74) *Attorney, Agent, or Firm* — Syncoda LLC; Feng Ma

(57) ABSTRACT

The present application provides a semiconductor structure and a forming method thereof. The method of forming the semiconductor structure includes: forming a capacitor base, the capacitor base including a plurality of capacitor switching structures and an isolation layer located between adjacent capacitor switching structures and covering top surfaces of the capacitor switching structures; removing the isolation layer covering the top surfaces of the capacitor switching structures, and exposing the capacitor switching structures; oxidizing a surface of the capacitor base exposing the capacitor switching structures, and forming an oxide layer; and removing the oxide layer, and exposing the capacitor switching structures.

20 Claims, 7 Drawing Sheets

(58) Field of Classification Search
CPC ......... H01L 21/02252; H01L 21/02065; H01L 21/02068; H01L 21/31116
See application file for complete search history.

(56) References Cited

U.S. PATENT DOCUMENTS

| | | | |
|---|---|---|---|
| 9,379,182 B1* | 6/2016 | Chen | H10D 30/031 |
| 10,622,221 B2 | 4/2020 | Mullick et al. | |
| 2007/0190797 A1 | 8/2007 | Wu et al. | |
| 2007/0246768 A1* | 10/2007 | Kim | H10D 30/6891 |
| | | | 257/315 |
| 2009/0269929 A1 | 10/2009 | Yang et al. | |
| 2014/0273471 A1* | 9/2014 | Gwak | H10B 12/033 |
| | | | 438/702 |
| 2020/0203272 A1* | 6/2020 | Doebler | H01L 23/5226 |
| 2021/0142946 A1* | 5/2021 | Kang | H10D 64/691 |
| 2022/0254715 A1* | 8/2022 | Stamper | H01L 21/76885 |

FOREIGN PATENT DOCUMENTS

| | | | |
|---|---|---|---|
| CN | 112908936 A | 6/2021 | |
| JP | S6290934 A | 4/1987 | |
| JP | H0779097 B2 | 8/1995 | |
| JP | 2004342789 A | 12/2004 | |

OTHER PUBLICATIONS

International Search Report cited in PCT/CN2022/076281 mailed Apr. 28, 2022, 8 pages.

* cited by examiner

Mixed gas of $O_2$, $H_2N_2$ and $N_2$

SEMICONDUCTOR STRUCTURE AND FORMING METHOD THEREOF

CROSS-REFERENCE TO RELATED APPLICATIONS

This is a continuation of International Application No. PCT/CN2022/076281, filed on Feb. 15, 2022, which claims the priority of Chinese Patent Application No. 202110890950.6, filed to the CNIPA on Aug. 4, 2021 and titled "SEMICONDUCTOR STRUCTURE AND FORMING METHOD THEREOF". The entire contents of International Application No. PCT/CN2022/076281 and Chinese Patent Application No. 202110890950.6 are incorporated herein by reference.

TECHNICAL FIELD

The present application relates to the technical field of integrated circuits (ICs), in particular to a semiconductor structure and a forming method thereof.

BACKGROUND

Dynamic random access memory (DRAM) is a commonly used semiconductor structure in electronic devices such as computers. It is composed of multiple memory cells, each of which usually includes a capacitor for storage of charges and a transistor for access of the capacitor. In the transistor, the gate is electrically connected to a word line (WL), the source is electrically connected to a bit line (BL), and the drain is electrically connected to the capacitor. The voltage on the WL controls the on or off of the transistor, so as to read data information stored in the capacitor or write data information into the capacitor through the BL.

The capacitor is connected to the drain through capacitor switching structures in the capacitor base. However, due to restrictions of existing manufacturing processes, it is likely to cause defects on the surface of the capacitor base and short circuits between adjacent capacitor switching structures.

Therefore, how to reduce the defects on the surface of the capacitor base and avoid the short circuits between the adjacent capacitor switching structures to improve electrical properties of the semiconductor structure is a technical problem to be solved urgently.

SUMMARY

The present application provides a semiconductor structure and a forming method thereof.

According to some embodiments, the present application provides a method of forming a semiconductor structure, including the following steps:
  forming a capacitor base, the capacitor base including a plurality of capacitor switching structures and an isolation layer located between adjacent capacitor switching structures and covering top surfaces of the capacitor switching structures;
  removing the isolation layer covering the top surfaces of the capacitor switching structures, and exposing the capacitor switching structures;
  oxidizing a surface of the capacitor base exposing the capacitor switching structures, and forming an oxide layer; and
  removing the oxide layer, and exposing the capacitor switching structures.

According to other embodiments, the present application further provides the semiconductor structure, which is formed with the above the method of forming the semiconductor structure.

DETAILED DESCRIPTION

Specific implementations of a semiconductor structure and a forming method thereof provided in the present application will be described below in detail with reference to the accompanying drawings.

Figure 1:
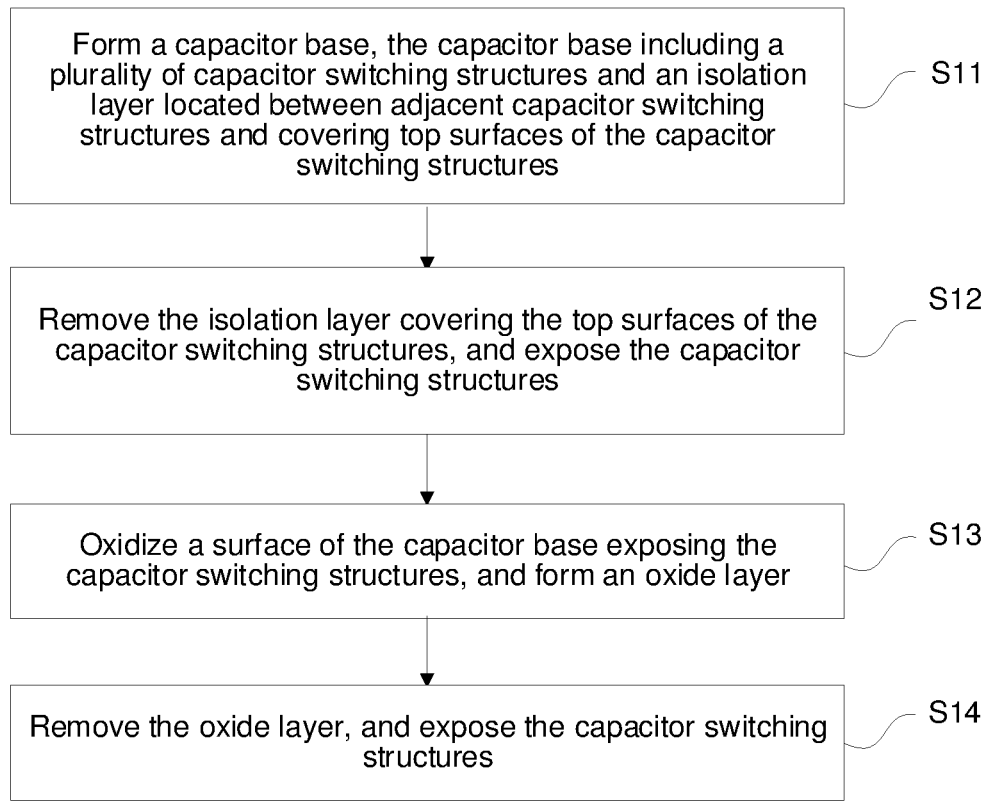
FIG. 1 is a flowchart of a method of forming a semiconductor structure according to a specific implementation of the present application.
Figure 2A:
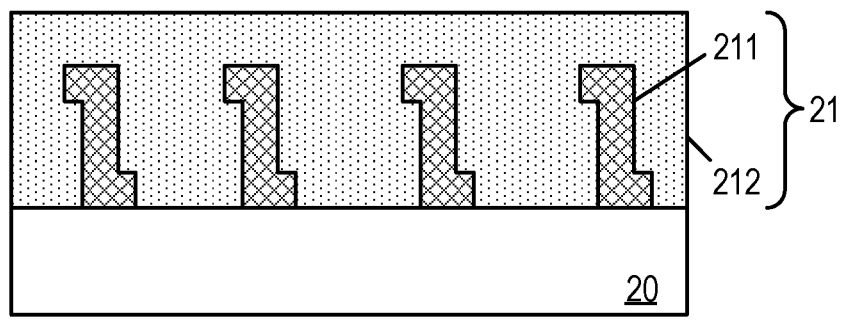
FIG. 2A to FIG. 2D each are a schematic cross-sectional view of a main process during formation of a semiconductor structure according to a specific implementation of the present application.

A specific implementation of the present application provides a method of forming a semiconductor structure. FIG. 1 is a flowchart of a method of forming a semiconductor device according to a specific implementation of the present application. FIG. 2A to FIG. 2D each are a schematic cross-sectional view of a main process during formation of a semiconductor structure according to a specific implementation of the present application. As shown in FIG. 1 and FIG. 2A to FIG. 2D, the method of forming a semiconductor structure includes the following steps:

Step S11: Form a capacitor base 21, the capacitor base 21 including a plurality of capacitor switching structures 211 and an isolation layer 212 located between adjacent capacitor switching structures 211 and covering top surfaces of the capacitor switching structures 211, as shown in FIG. 2A.

In some embodiments, the step of forming a capacitor base 21 specifically includes:
  Provide a substrate 20, a plurality of capacitor contact regions being provided in the substrate 20.
  Form the plurality of the capacitor switching structures 211 on a surface of the substrate 20, the plurality of the capacitor switching structures 211 being electrically connected to the plurality of the capacitor contact regions in one-to-one correspondence.
  Form the isolation layer 212 filling gaps between the adjacent capacitor switching structures 211 and covering the top surfaces of the capacitor switching structures 211.

Specifically, the substrate 20 may be, but not limited to, a silicon substrate. The specific implementation is described by taking the substrate 20 as the silicon substrate for example. In other examples, the substrate 20 may be a semiconductor substrate such as a gallium nitride substrate, a gallium arsenide substrate, a gallium carbide substrate, a silicon carbide substrate or a silicon-on-insulator (SOI) substrate. A plurality of active regions are arranged in the substrate 20 in an array. The active regions each include a BL contact region and a capacitor contact region. Prior to formation of the plurality of capacitor switching structures 211, a capacitor contact layer may further be formed on a surface of the substrate 20. Capacitor contact points electrically contacting the plurality of capacitor contact regions in one-to-one correspondence are provided in the capacitor contact layer. The capacitor contact points may be made of polycrystalline silicon. Thereafter, the plurality of capacitor switching structures 211 electrically connected to a plurality of the capacitor contact points in one-to-one correspondence are formed. The capacitor switching structures 211 may be made of a conductive metal material such as tungsten. The plurality of capacitor switching structures 211 are independent of each other, namely gaps are provided between adjacent capacitor switching structures 211. In order to avoid influences between adjacent capacitor switching structures 211, after formation of the plurality of capacitor switching structures 211, an insulating material is deposited in the gaps between the adjacent capacitor switching structures 211 and covers the top surfaces of the capacitor switching structures 211 to form the isolation layer 212 shown in FIG. 2A. The isolation layer 212 may be made of an oxide material (such as silicon dioxide), and may also be made of a nitride material (such as silicon nitride).

Figure 2B:
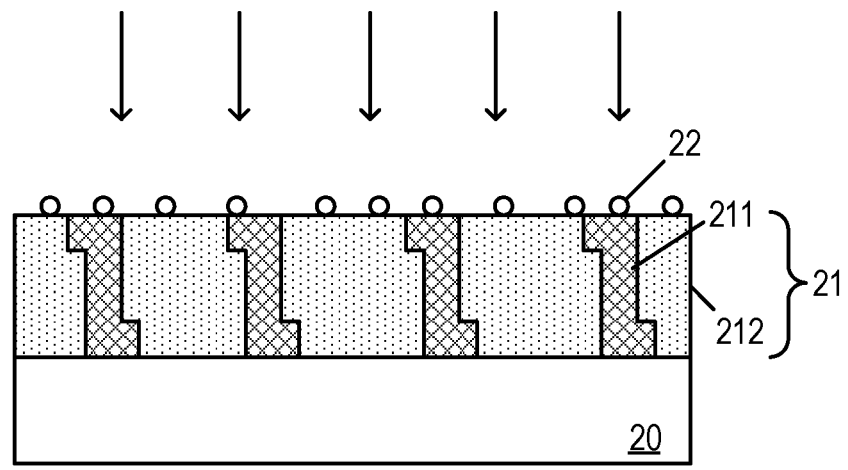

Step S12: Remove the isolation layer 212 covering the top surfaces of the capacitor switching structures 211, and expose the capacitor switching structures 211, as shown in FIG. 2B.

In some embodiments, the step of removing the isolation layer 212 covering the top surfaces of the capacitor switching structures 211 specifically includes:

Etch the isolation layer 212 with a dry etching process.

In some embodiments, the isolation layer 212 is made of a nitride material; and the step of etching the isolation layer 212 with a dry etching process specifically includes:

Etch the isolation layer 212 with a mixed gas of $CF_4$, $CHF_3$ and $O_2$ as an etching gas.

Specifically, when the isolation layer 212 is made of the nitride material such as silicon nitride, the mixed gas of $CF_4$, $CHF_3$ and $O_2$ may be used as the etching gas to etch the isolation layer 212 downward along a direction (namely a direction perpendicular to the surface of the capacitor base 21) indicated by arrows in FIG. 2B. With the capacitor switching structures 211 as etching cutoff layers, a part of the isolation layer 212 is removed to expose the top surfaces of the capacitor switching structures 211, as shown in FIG. 2B. When the mixed gas of $CF_4$, $CHF_3$ and $O_2$ is used as the etching gas for etching, plasmas formed by the mixed gas of $CF_4$, $CHF_3$ and $O_2$ will damage the top surfaces of the capacitor switching structures 211. As a result, material particles in the capacitor switching structures 211 are bombarded, at least one of the material particles is further oxidized easily by $O_2$ to form particulate matters 22 including the material particles and material particle oxides, and the particulate matters 22 are adhered on the surface of the capacitor base 21, as shown in FIG. 2B.

With the capacitor switching structures 211 made of the tungsten as an example, the plasmas formed by the mixed gas of $CF_4$, $CHF_3$ and $O_2$ bombard the surfaces of the capacitor switching structures 211, such that tungsten particles and tungsten oxide particles are left on the surface of the capacitor base 21

Figure 2C:
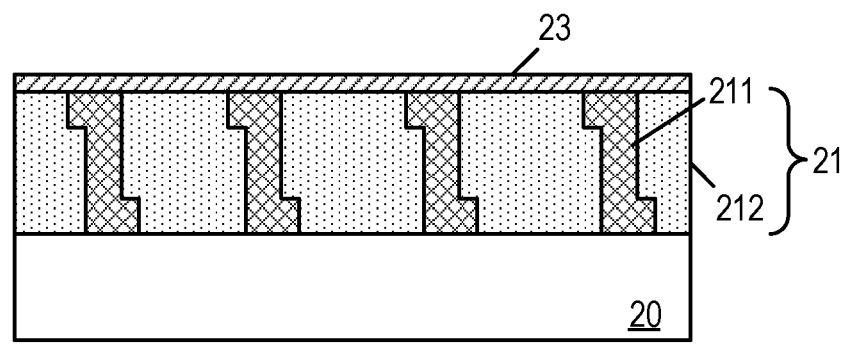

Step S13: Oxidize a surface of the capacitor base 21 exposing the capacitor switching structures 211, and form an oxide layer 23, as shown in FIG. 2C.

In the specific implementation, upon exposure of the top surfaces of the capacitor switching structures 211, the material particles left on the surface of the capacitor base 21 and the top surfaces of the capacitor switching structures 211 are oxidized to form the oxide layer 23 including same components as the material particle oxide. The uniform material on the top surface of the capacitor base 21 facilitates subsequent thorough removal of the particulate matters 22 on the surface of the capacitor base 21, and avoids the short circuits between the adjacent capacitor switching structures 211. By partially or completely removing damaged regions on the surfaces of the capacitor switching structures 211, defects on the surfaces of the capacitor switching structures 211 are reduced or completely eliminated.

In some embodiments, the step of oxidizing a surface of the capacitor base 21 exposing the capacitor switching structures 211 specifically includes:

Oxidize, with an $O_2$ plasma, the surface of the capacitor base 21 exposing the capacitor switching structures 211.

In some embodiments, a reaction temperature is 25-300° C. when the $O_2$ plasma is used to oxidize the surface of the capacitor base 21 exposing the capacitor switching structures 211. For example, when the $O_2$ plasma is used to oxidize the surface of the capacitor base 21 exposing the capacitor switching structures 211, the reaction temperature is 25° C.-100° C., 150° C.-200° C. or 200° C.-250° C., preferably 200° C.-250° C.

In some embodiments, the step of oxidizing, with an $O_2$ plasma, the surface of the capacitor base 21 exposing the capacitor switching structures 211 specifically includes:

Transmit a mixed gas plasma including at least the $O_2$ plasma and an $H_2N_2$ plasma to the surface of the capacitor base 21 exposing the capacitor switching structures 211.

In some embodiments, the mixed gas plasma has a flow of 100 sccm-15,000 sccm. For example, the mixed gas plasma has the flow of 100 sccm-500 sccm, 400 sccm-100 sccm, 1,000 sccm-5,000 sccm, 8,000 sccm-12,000 sccm or 10,000 sccm-15,000 sccm, preferably 8,000 sccm-12,000 sccm. At an initial stage of oxidizing, with the $O_2$ plasma, the surface of the capacitor base 21 exposing the capacitor switching structures 211, there may be a relatively high flow of the mixed gas plasma. At a nearly saturated stage of oxidization, the flow of the mixed gas plasma may be adjusted to be relatively low. The surfaces of the capacitor switching structures 211 are oxidized in case of the relatively high flow of the mixed gas plasma, and reaction residues are removed in case of the relatively low flow of the mixed gas plasma.

In some embodiments, the mixed gas plasma has a pressure of 10 mtorr-10,000 mtorr. For example, the mixed gas plasma has the pressure of 10 mtorr-100 mtorr, 50 mtorr-500 mtorr, 500 mtorr-1,200 mtorr or 2,000 mtorr-10,000 mtorr, preferably 500 mtorr-1,200 mtorr.

In some embodiments, the step of transmitting a mixed gas plasma including at least the $O_2$ plasma and an $H_2N_2$ plasma to the surface of the capacitor base 21 exposing the capacitor switching structures 211 specifically includes:

Ionize, with an RF power of 100 W-10,000 W, a mixed gas including $O_2$ and $H_2N_2$ to form the mixed gas plasma. For example, the RF power may be 100 W-500 W, 500 W-1,000 W, 2,500 W-5,000 W or 5,000 W-10,000 W, preferably 2,500 W-5,000 W.

Transmit the mixed gas plasma to the surface of the capacitor base 21 exposing the capacitor switching structures 211.

Figure 3A:
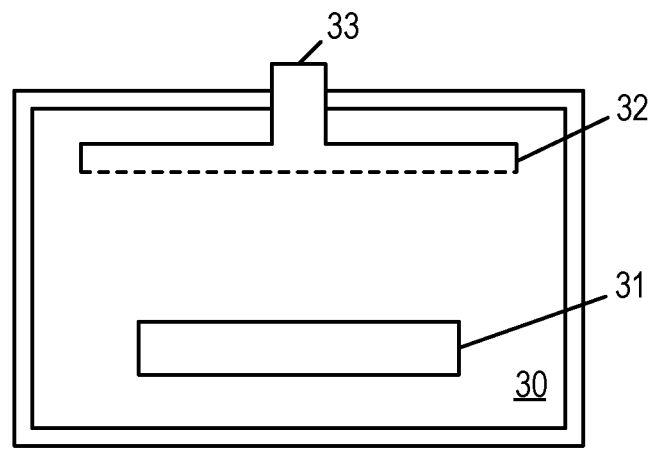
FIG. 3A to FIG. 3D each are a schematic cross-sectional view of a main process during formation of an oxide layer according to a specific implementation of the present application.
Figure 3B:
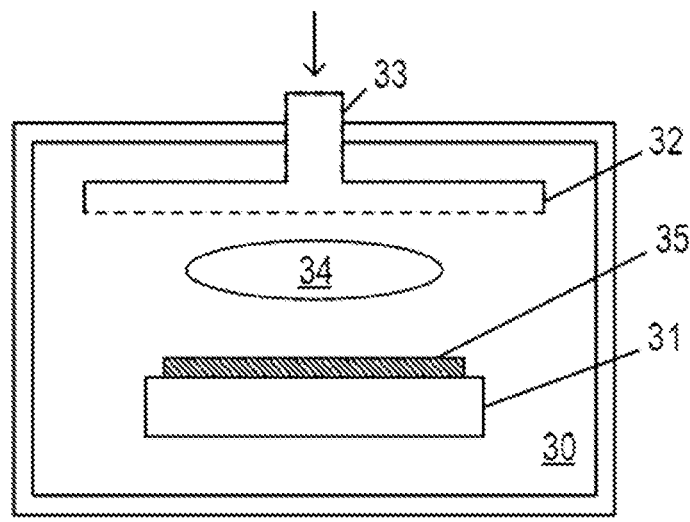
Figure 3C:
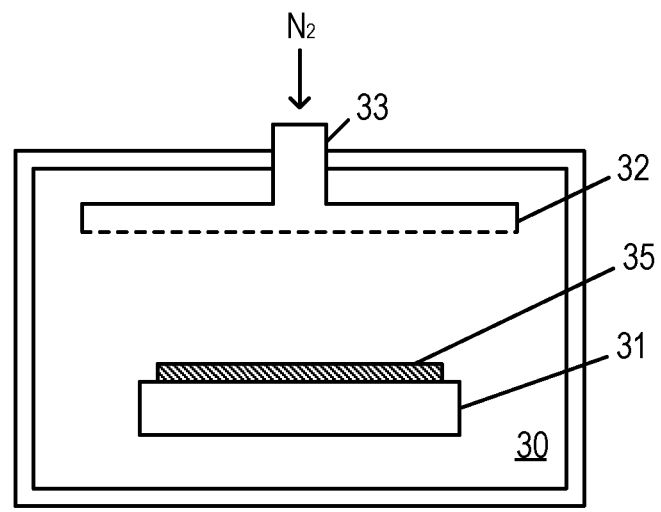
Figure 3D:
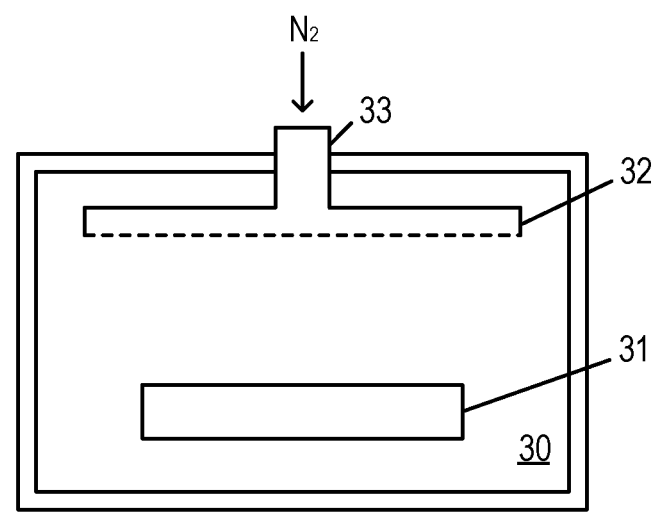

FIG. 3A to FIG. 3D each are a schematic cross-sectional view of a main process during formation of an oxide layer according to a specific implementation of the present application. For example, the oxide layer 23 is specifically formed as follows: A reaction chamber 30 is provided, wherein the reaction chamber 30 is provided therein with a support table 31, and a showerhead 32 on an upper part of the reaction chamber 30; the showerhead communicates with an air inlet channel 33; and before the capacitor base 21 is placed into the reaction chamber 30, the support table 31 for supporting the capacitor base 21 is preheated to 25° C.-300° C., as shown in FIG. 3A. The capacitor base 21 is placed on a surface of the support table 31, and a mixed gas of $O_2$, $H_2N_2$ and $N_2$ or a mixed gas of $O_2$, $H_2N_2$ and Ar as a wet etching gas is transmitted to the reaction chamber 30 through the air inlet channel 33, wherein the dry etching gas is uniformly dispersed by the showerhead 32 and ionized at an RF power of 100 W-10,000 W to form a mixed gas plasma including an $O_2$ plasma, an $H_2N_2$ plasma and an $N_2$ plasma or a mixed gas plasma including an $O_2$ plasma, an $H_2N_2$ plasma and an Ar plasma, and the mixed gas plasma oxidizes the surface of the capacitor base 21 to form the oxide layer 23, as shown in FIG. 3B. In the step herein, the mixed gas plasma has a flow of 100 sccm-15,000 sccm and a pressure of 10 mtorr-10,000 mtorr. With the dry etching gas at the low flow and low pressure, the oxidation endpoint is controlled conveniently to avoid excessive oxidation of the capacitor switching structures 211. $N_2$ purging is continuously carried out on the reaction chamber 30 to cool the capacitor base 21 to a room temperature, as shown in FIG. 3C. The capacitor base 21 is taken out from the reaction chamber 30.

Figure 2D:
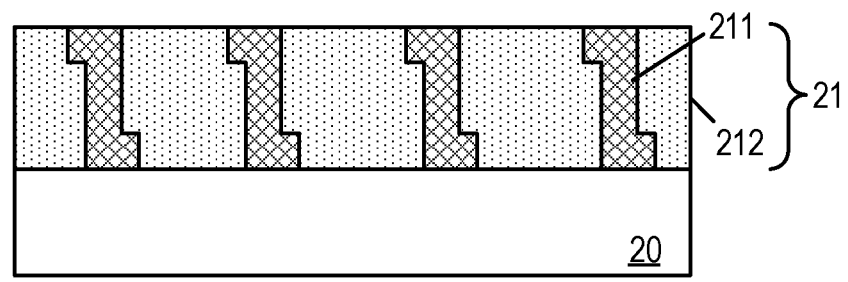

Step S14: Remove the oxide layer 23, and expose the capacitor switching structures 211, as shown in FIG. 2D.

In some embodiments, the step of removing the oxide layer 23 specifically includes:

Clean the capacitor base 21.

In some embodiments, the step of cleaning the capacitor base 21 specifically includes:

Clean the capacitor base 21 with a DHF solution.

In some embodiments, a volume ratio of HF to $H_2O$ in the DHF solution is (10:1)-(1,000:1). For example, the volume ratio of the HF to the $H_2O$ in the DHF solution is (10:1)-(50:1), (20:1)-(100:1), (200:1)-(800:1) or (500:1)-(1,000:1), preferably (200:1)-(800:1).

Figure 4A:
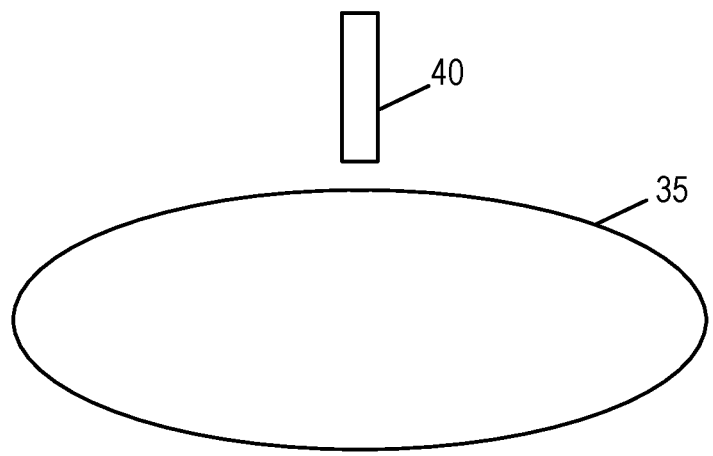
FIG. 4A to FIG. 4E each are a schematic cross-sectional view of a main process during removal of an oxide layer according to a specific implementation of the present application.
Figure 4B:
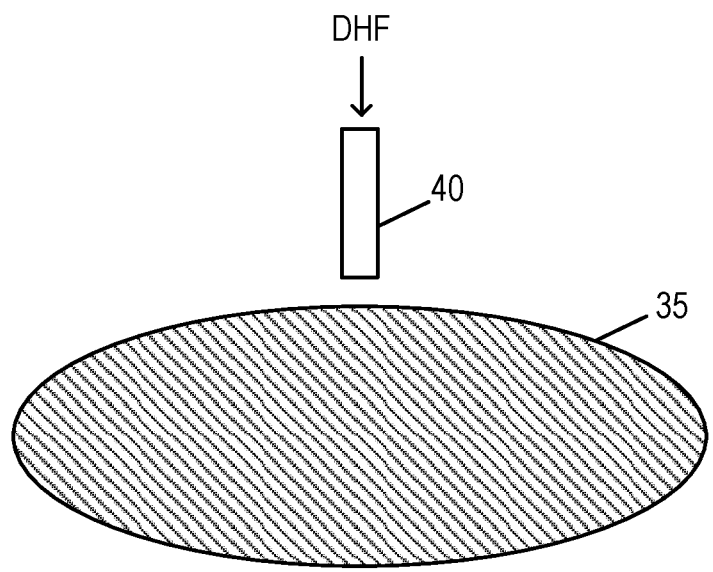

FIG. 4A to FIG. 4E each are a schematic cross-sectional view of a main process during removal of an oxide layer according to a specific implementation of the present application. For example, the step of cleaning the capacitor base 21 specifically includes: Deionized water is sprayed to the oxide layer 23 on the capacitor base 21 through a first spray tube 40 to wet the oxide layer 23, as shown in FIG. 4A. The DHF (HF diluted with the deionized water) solution is continuously sprayed to the surface of the oxide layer 23 of the capacitor base 21 through the first spray tube 40, to remove particulate pollutants and native oxides on the surface of the oxide layer 23 and expose the oxide layer 23, as shown in FIG. 4B.

In some embodiments, the step of removing the oxide layer 23 specifically includes:

Remove the oxide layer 23 with a wet etching process.

In some embodiments, the step of removing the oxide layer 23 with a wet etching process specifically includes:

Remove the oxide layer 23 with a wet etchant having an etch selectivity of greater than or equal to 10:1 for the oxide layer 23 and the capacitor switching structures 211.

In the specific implementation, the particulate matters left on the surface of the capacitor base 21 contain uniform components by oxidation, and components in the oxide layer 23 are different from those in the capacitor switching structures 211. With the etchant having the high etch selectivity for the oxide layer 23 and the capacitor switching structures 211, the oxide layer 23 is fully removed, without damaging the capacitor switching structures 211.

In some embodiments, the capacitor switching structures 211 are made of a metal material, and the step of removing the oxide layer 23 with a wet etching process specifically includes:

Remove the oxide layer 23 with an alkaline solution as a wet etchant.

In some embodiments, the step of removing the oxide layer 23 with an alkaline solution as a wet etchant specifically includes:

Remove the oxide layer 23 with a mixed solution of $NH_4OH$ and $H_2O$ as the wet etchant.

In some embodiments, a volume ratio of the $NH_4OH$ to the $H_2O$ in the wet etchant is (5:1)-(1,000:1). For example, the volume ratio of the $NH_4OH$ to the $H_2O$ in the wet etchant is (5:1)-(100:1), (20:1)-(200:1), (50:1)-(500:1) or (100:1)-(1,000:1), preferably (50:1)-(500:1).

In some embodiments, after removing the oxide layer 23, the forming method further includes the following step:

Dry the capacitor base 21.

In some embodiments, the step of drying the capacitor base 21 specifically includes:

Purge the capacitor base 21 with a mixed gas of nitrogen and isopropanol.

Figure 4C:
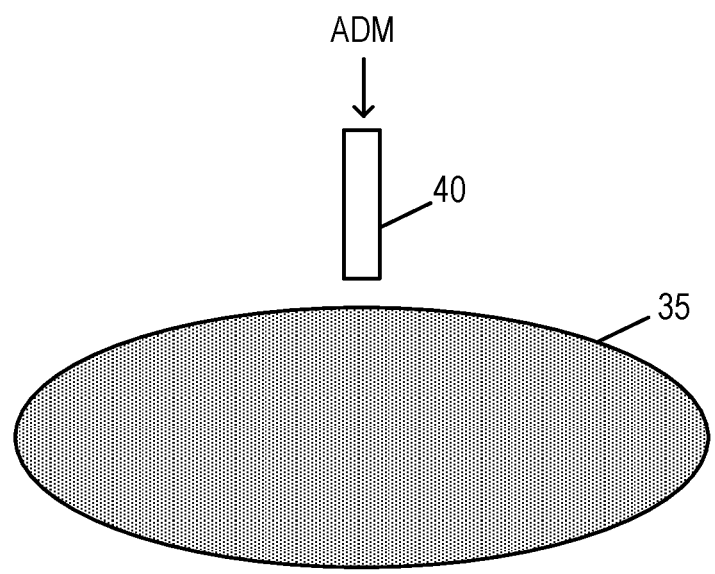
Figure 4D:
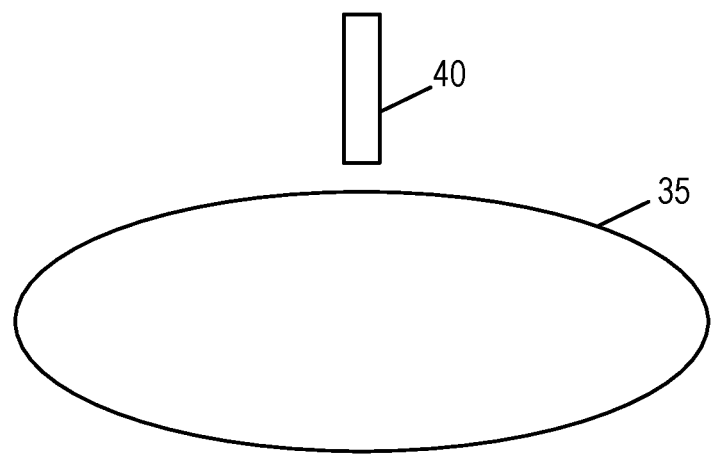
Figure 4E:
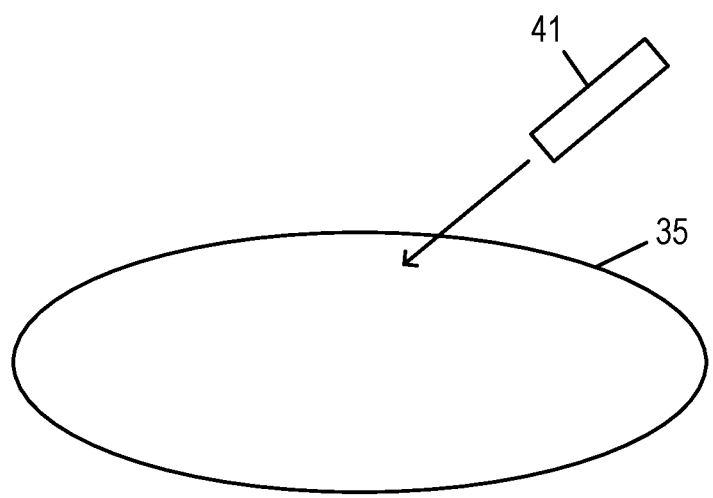

The following descriptions are made by taking the capacitor switching structures 211 made of the tungsten, and the oxide layer 23 made of the tungsten oxide as an example. An ADM solution including $NH_4OH$ and $H_2O$ is sprayed to the surface of the oxide layer 23 through the first spray tube 40, as shown in FIG. 4C. The ADM solution can react with the tungsten oxide, rather than the tungsten. The ADM solution has an etch selectivity of 50:1 for the tungsten oxide and the tungsten, thus fully removing the tungsten oxide without damaging the tungsten. As shown in FIG. 4D, deionized water is sprayed to the surface of the capacitor base 21 again through the first spray tube 40 to remove the residual ADM solution. As shown in FIG. 4E, the mixed gas of nitrogen and isopropanol is sprayed to the surface of the capacitor base 21 by inclining the second spray tube 41 (for example, toward a direction indicated by the arrow in FIG. 4E) to avoid oxidation of the tungsten due to residual moisture.

A specific implementation of the present application further provides a semiconductor structure, which is formed with the above method of forming a semiconductor structure.

According to the semiconductor structure and the forming method thereof provided in the specific implementations, after the isolation layer is removed and the top surfaces of the capacitor switching structures are exposed, the surfaces of the capacitor switching structures and conductive particulate matters left on the surfaces of the capacitor switching structures are oxidized to implement the uniform surface material of the capacitor base. Upon the removal of the oxide layer, the defects on the surfaces of the capacitor switching structures as well as the particulate matters on the surfaces of the capacitor switching structures and on the surface of the isolation layer can be removed. Therefore, the present application reduces the defects on the surfaces of the capacitor switching structures and avoids the short circuits between the capacitor switching structures to improve electrical properties of the semiconductor structure.

The above described are merely preferred implementations of the present application. It should be noted that several improvements and modifications may further be made by a person of ordinary skill in the art without departing from the principle of the present application, and such improvements and modifications should also be deemed as falling within the protection scope of the present application.

The invention claimed is:

1. A method of forming a semiconductor structure, comprising:
    forming a capacitor base, the capacitor base comprising a plurality of capacitor switching structures and an isolation layer located between adjacent capacitor switching structures and covering top surfaces of the capacitor switching structures, wherein the isolation layer is made of a nitride material;
    etching the isolation layer with a mixed gas of $CF_4$, $CHF_3$ and $O_2$ as an etching gas to exposes the top surfaces of the capacitor switching structures, wherein particulate matters are adhered on the top surfaces of the capacitor switching structures and a surface of the isolation layer during etching the isolation layer;
    oxidizing, with an $O_2$ plasma, the top surfaces of the capacitor switching structures, the surface of the isolation layer and the particulate matters to form an oxide layer on the top surfaces of the capacitor switching structures and the surface of the isolation layer; and
    removing the oxide layer to expose the top surfaces of the capacitor switching structures.

2. The method of forming the semiconductor structure according to claim 1, wherein the forming a capacitor base comprises:
    providing a substrate, a plurality of capacitor contact regions being provided in the substrate;
    forming the plurality of the capacitor switching structures on a surface of the substrate, the plurality of the capacitor switching structures being electrically connected to the plurality of the capacitor contact regions in one-to-one correspondence; and
    forming the isolation layer filling gaps between the adjacent capacitor switching structures and covering the top surfaces of the capacitor switching structures.

3. The method of forming the semiconductor structure according to claim 1, wherein a reaction temperature is 25° C.-300° C. when the $O_2$ plasma is used to oxidize the top surfaces of the capacitor switching structures, the surface of the isolation layer and the particulate matters.

4. The method of forming the semiconductor structure according to claim 1, wherein oxidizing, with an $O_2$ plasma, the top surfaces of the capacitor switching structures, the surface of the isolation layer and the particulate matters to form an oxide layer on the top surfaces of the capacitor switching structures and the surface of the isolation layer comprises:
    transmitting a mixed gas plasma comprising at least the $O_2$ plasma and an $H_2N_2$ plasma to the top surfaces of the capacitor switching structures, the surface of the isolation layer.

5. The method of forming the semiconductor structure according to claim 4, wherein the mixed gas plasma has a flow of 100 sccm-15,000 sccm, and a pressure of 10 mtorr-10,000 mtorr.

6. The method of forming the semiconductor structure according to claim 4, wherein the transmitting a mixed gas plasma comprising at least the $O_2$ plasma and an $H_2N_2$ plasma to the top surfaces of the capacitor switching structures, the surface of the isolation layer comprises:
    ionizing, with a radio frequency power of 100 W-10,000 W, a mixed gas comprising $O_2$ and $H_2N_2$, and forming the mixed gas plasma; and
    transmitting the mixed gas plasma to the top surfaces of the capacitor switching structures, the surface of the isolation layer.

7. The method of forming the semiconductor structure according to claim 1, wherein the removing the oxide layer comprises:
    removing the oxide layer with a wet etching process.

8. The method of forming the semiconductor structure according to claim 7, wherein the capacitor switching structures are made of a metal material, and the removing the oxide layer with a wet etching process comprises:
    removing the oxide layer with an alkaline solution as a wet etchant.

9. The method of forming the semiconductor structure according to claim 8, wherein the removing the oxide layer with an alkaline solution as a wet etchant comprises:
    removing the oxide layer with a mixed solution of $NH_4OH$ and $H_2O$ as the wet etchant.

10. The method of forming the semiconductor structure according to claim 9, wherein a volume ratio of the $NH_4OH$ to the $H_2O$ in the wet etchant is (5:1)-(1,000:1).

11. The method of forming the semiconductor structure according to claim 1, after the removing the oxide layer, further comprising:
    drying the capacitor base.

12. The method of forming the semiconductor structure according to claim 11, wherein the drying the capacitor base comprises:
    purging the capacitor base with a mixed gas of nitrogen and isopropanol.

13. A method of forming a semiconductor structure, comprising:
    forming a capacitor base, the capacitor base comprising a plurality of capacitor switching structures and an isolation layer located between adjacent capacitor switching structures and covering top surfaces of the capacitor switching structures, wherein the isolation layer is made of a nitride material;
    etching the isolation layer with a mixed gas of $CF_4$, $CHF_3$ and $O_2$ as an etching gas to exposes the top surfaces of the capacitor switching structures, wherein the top surfaces of the capacitor switching structures are flush with a top surface of the isolation layer, and particulate matters are adhered on the top surfaces of the capacitor switching structures and the top surface of the isolation layer during etching the isolation layer;
    oxidizing, with an $O_2$ plasma, the top surfaces of the capacitor switching structures, the top surface of the isolation layer and the particulate matters to form an oxide layer on the top surfaces of the capacitor switching structures and the top surface of the isolation layer; and
    removing the oxide layer to expose the top surfaces of the capacitor switching structures.

14. The method of forming the semiconductor structure according to claim 13, wherein the forming a capacitor base comprises:
    providing a substrate, a plurality of capacitor contact regions being provided in the substrate;
    forming the plurality of the capacitor switching structures on a surface of the substrate, the plurality of the capacitor switching structures being electrically connected to the plurality of the capacitor contact regions in one-to-one correspondence; and forming the isolation layer filling gaps between the adjacent capacitor switching structures and covering the top surfaces of the capacitor switching structures.

15. The method of forming the semiconductor structure according to claim 13, wherein the removing the oxide layer comprises:

removing the oxide layer with a wet etching process.

16. The method of forming the semiconductor structure according to claim 15, wherein the capacitor switching structures are made of a metal material, and the removing the oxide layer with a wet etching process comprises:

removing the oxide layer with an alkaline solution as a wet etchant.

17. The method of forming the semiconductor structure according to claim 16, wherein the removing the oxide layer with an alkaline solution as a wet etchant comprises:

removing the oxide layer with a mixed solution of $NH_4OH$ and $H_2O$ as the wet etchant.

18. The method of forming the semiconductor structure according to claim 17, wherein a volume ratio of the $NH_4OH$ to the $H_2O$ in the wet etchant is (5:1)-(1,000:1).

19. The method of forming the semiconductor structure according to claim 13, after the removing the oxide layer, further comprising:

drying the capacitor base.

20. The method of forming the semiconductor structure according to claim 19, wherein the drying the capacitor base comprises:

purging the capacitor base with a mixed gas of nitrogen and isopropanol.

* * * * *